United States Patent [19]

Feuerbaum et al.

[11] Patent Number: 5,780,859
[45] Date of Patent: Jul. 14, 1998

[54] ELECTROSTATIC-MAGNETIC LENS ARRANGEMENT

[75] Inventors: Hans-Peter Feuerbaum, München; Jürgen Frosien, Riemerling; Koshi Ueda, Munich; Toshimichi Iwai, Munich; Gerald Schönecker, Munich, all of Germany

[73] Assignee: ACT Advanced Circuit Testing Gesellschaft, Munich, Germany

[21] Appl. No.: 791,091

[22] Filed: Jan. 29, 1997

[30]  Foreign Application Priority Data

Feb. 16, 1996 [DE] Germany ............... 196 05 855.4
Jul. 3, 1996 [EP] European Pat. Off. ............ 96110765

[51] Int. Cl.$^6$ .................................................. H01J 49/06
[52] U.S. Cl. .......................... 250/396 R; 250/396 ML; 250/310
[58] Field of Search .................... 250/396 R, 396 ML, 250/310, 311, 305

[56]  References Cited

U.S. PATENT DOCUMENTS 4,785,176  11/1988  Frosien et al. ............ 250/396 R
4,823,005   4/1989  Garth ........................ 250/396 R

FOREIGN PATENT DOCUMENTS 0242602  3/1987  Germany.
1395201  5/1995  United Kingdom.

Primary Examiner—Kiet T. Nguyen
Attorney, Agent, or Firm—Learman & McCulloch

[57]  ABSTRACT

An electrostatic-magnetic lens arrangement is for focusing charged particles as well as a charged particle beam device with such a lens arrangement which has a magnetic lens and an electrostatic lens incorporated into the magnetic lens, the magnetic lens being constructed as a single-pole lens.

22 Claims, 2 Drawing Sheets

ELECTROSTATIC-MAGNETIC LENS ARRANGEMENT

The invention relates to an electrostatic-magnetic lens arrangement for focusing charged particles with a magnetic lens and an electrostatic lens disposed incorporated into the magnetic lens. The invention further relates to a charged particle beam device with such an electrostatic-magnetic lens arrangement.

BACKGROUND OF THE INVENTION

An electrostatic-magnetic lens arrangement is known from EP-B-0 242 602, in which there is provided a magnetic lens which generates a rotationally symmetrical magnetic field and an immersion lens which is disposed within the magnetic lens symmetrically with the axis of symmetry thereof and which has at least two electrodes lying at different potentials. The charged particles, for example electrons, are decelerated in the field of the immersion lens from a first energy to a substantially lower second energy. Very good lens properties are produced with a relatively short focal length.

However, in this known lens arrangement the specimens must be disposed very close to the magnetic lens during the measurement. However, this is often no longer possible in the case of high specimens like specimens with ICs and associated sockets. An arrangement of the specimen close to the magnetic lens is also limited by the design of the specimen holder. Since on the one hand the specimen has to be contacted during measurement and on the other hand simple exchange of the specimens must be ensured, a greater working distance with good resolving and imaging properties would be desirable.

A charged particle beam device which provides a single-pole lens for focusing the particles is known from GB-B-1 395 201. In contrast to a bipolar lens, in the single-pole lens the magnetic field is essentially generated outside the lens, so that greater working distances can be achieved. Such single-pole lenses are distinguished by relatively good lens properties. However, if such lenses are used in the low voltage range, i.e. at final beam energies of the charged particles of less than 5 keV, preferably below 2.5 keV, the lens properties are too poor for many applications at working distances of more than 5 mm.

The object of the invention, therefore, is to provide an electrostatic-magnetic lens arrangement as well as a charged particle beam device which is distinguished particularly in the low voltage range by a great working distance and good lens properties.

SUMMARY OF THE INVENTION

The single-pole lens can be combined particularly advantageously with an electrostatic lens, in which case attention must be paid to ensure that the field generated by the electrostatic lens is not so strong that it alone is sufficient to focus the beam. With the lens arrangement according to the invention working distances of more than 5 mm, particularly between 5 and 30 mm, can be achieved.

In a further preferred embodiment the lens arrangement has an additional control electrode which is situated in the beam path between the electrostatic lens and a specimen. This control electrode can be connected to a variable potential in order to be able to adjust the electrical field strength in the region of the specimen. For specimens which are particularly sensitive to charging it is then possible to achieve field cancellation in the region of the specimen.

THE DRAWINGS

DETAILED DESCRIPTION

Figure 1:
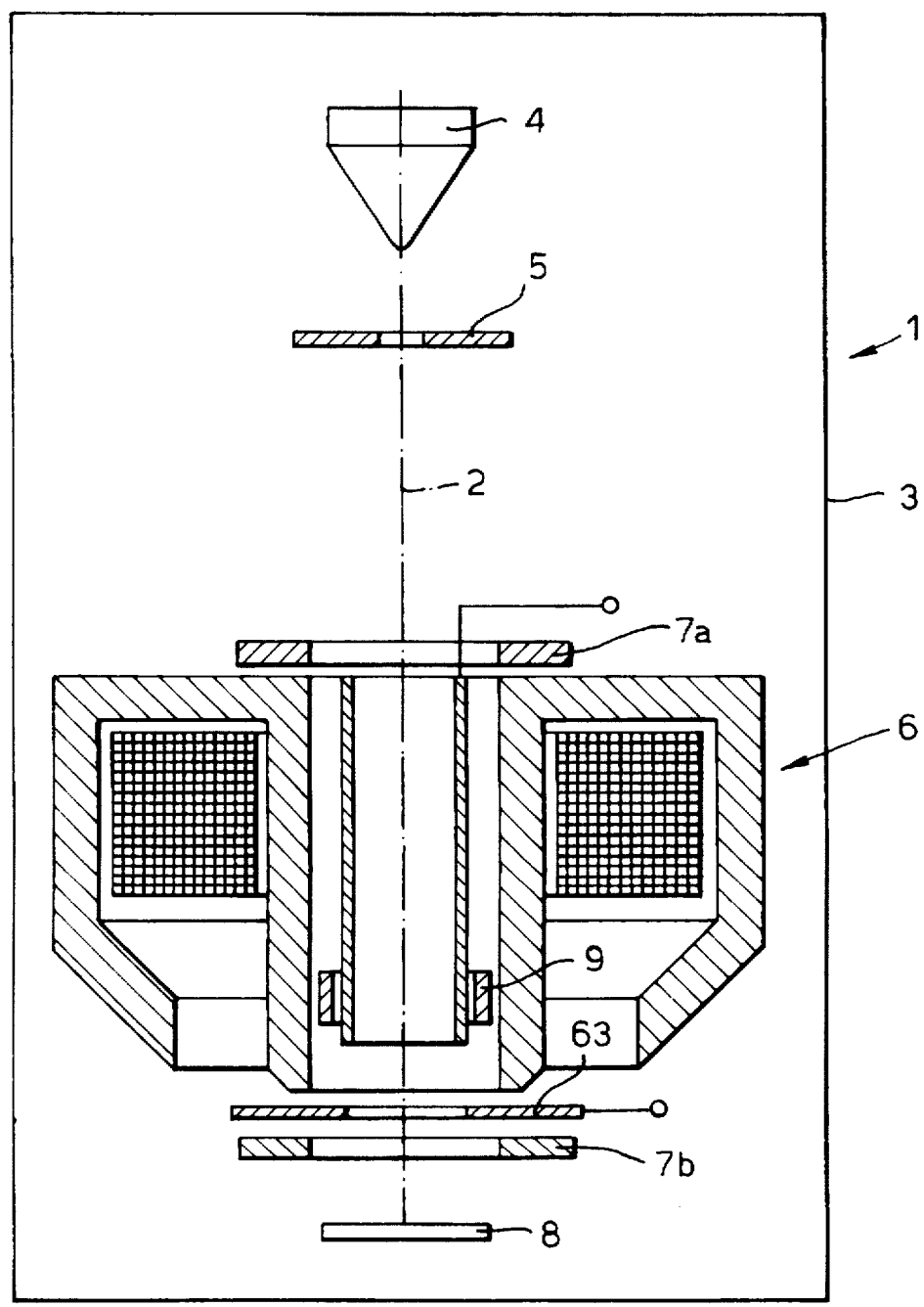
FIG. 1 shows a schematic representation of a charged particle beam device according to the invention.

FIG. 1 shows a charged particle beam device with which a concentrated particle beam 2, for example an electron beam, can be generated in an optical column 3. In addition to a number of magnetic and/or electrical lenses and diaphragms (not shown here) for beam formation, this column 3 essentially has a source 4 for generating the particle beam 2, a lens arrangement 6 as well as at least one detector 7a or 7b. A blanking system 5 could also be provided for blanking the charged particle beam.

The particle beam 2 generated in the source 4 is focused by the electrostatic-magnetic lens arrangement 6 onto a specimen 8. The particles emitted there pass through the lens arrangement 6 to the detector 7a. However, instead of the detector 7a a detector 7b could also be provided between the specimen 8 and the electrostatic-magnetic lens arrangement 6. To further improve the evaluation of the secondary or the back-scattered particles both the detector 7a and the detector 7b could be provided in a particle beam device. In this case at least one of the two detectors could also be of segmented construction, so that the detector surface is divided into segments the output signals of which can be processed separately from one another.

For scanning the specimen with the particle beam 2 a deflector arrangement 9 is also provided which in the illustrated embodiment is disposed within the lens arrangement 6.

The lens arrangement 6 according to the invention is explained in greater detail below with reference to FIG. 2. It consists essentially of a magnetic lens constructed as a single-pole lens 61 as well as an electrostatic lens 62 which is situated within the magnetic lens and generates a rotationally symmetrical electrical field.

This electrostatic lens has two electrodes held at different potentials, and these electrodes can have different potentials applied to them such that the charged particles, for example the electrons, are decelerated in the field of the electrostatic lens from a first energy to a lower second energy. In this case the first energy is 1.2 to 10 times higher than the second energy, in order to achieve the greatest possible working distance with good resolving and imaging properties.

In the illustrated embodiment one of the two electrodes is formed by a cylindrical beam tube 62a which is situated concentrically in an internal bore 61a in the single-pole lens 61. The beam tube 62a is preferably made from non-conductive material which is coated with a thin conductive layer. The second electrode of the electrostatic lens is formed by the lower end of the inner pole piece 61b held at earth potential. However, it could also be provided as a separate electrode. The second electrode does not, however, have to be at earth potential, but can also be set at another potential.

Figure 2:
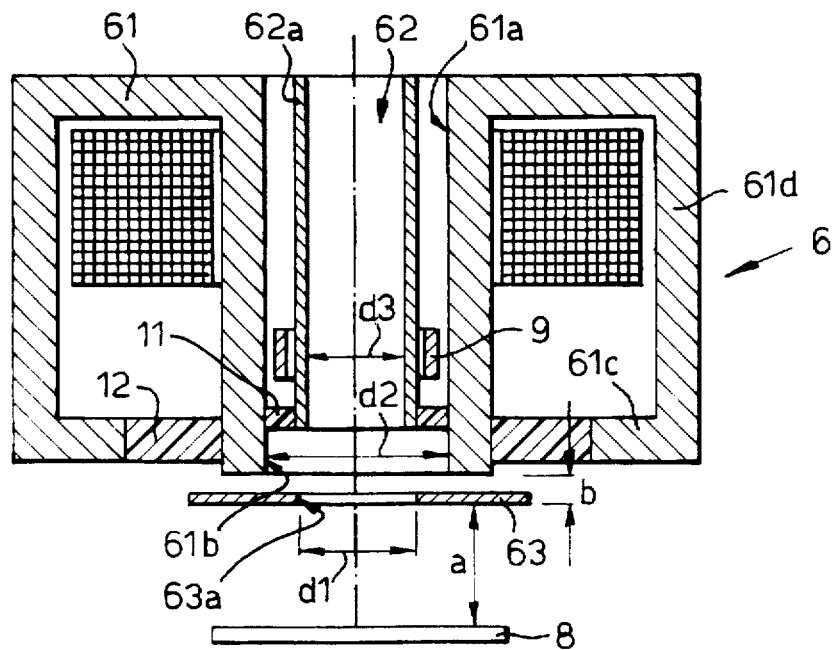
FIG. 2 shows a schematic representation of a lens arrangement according to the invention.

The single-pole lens 61 illustrated in FIG. 2 has an inner pole piece 61b as well as an outer pole piece 61c which are of essentially cylindrical shape. A field coil 61d is provided for excitation of the magnetic lens.

An additional control electrode 63 is provided in the beam path between the electrostatic lens 62 and the specimen 8 and is connected to a variable voltage source, which is not shown in greater detail, in order to be able to adjust the electrical field strength in the region of the specimen. The voltage on the control electrode can for example be adjusted between −100 V and +100 V.

The deflector arrangement 9 is preferably constructed as a single-stage deflector arrangement and provided between the beam tube 62a and the wall delimiting the internal bore 61a of the single-pole lens 61.

The charged particle beam device also has a vacuum facility for generating a vacuum in the region of the particle beam. In order to be able better to dissipate the heat generated by the deflector arrangement a seal 11 is preferably provided between the beam tube 62a and the single-pole lens 61 so that the deflector arrangement 9 is surrounded by air and thus an improved heat dissipation is ensured. Equally advantageously, a further seal 12 can be provided in the single-pole lens 61 to shield the field coil 61d from the vacuum.

With the aid of the electrostatic lens 62 the charged particles are decelerated to a final beam energy of lower than 5 keV, preferably between 0.5 and 2.5 keV, a working distance of more than 5 mm being produced between the specimen 8 and the lens arrangement 6. The working distance a is formed here by the distance between the specimen 8 and the control electrode 63.

According to the invention the distance between the control electrode 63 and the specimen 8 (=working distance a) is at least three times the distance b between the control electrode 63 and the single-pole lens 61. The control electrode 63 has an opening 63a, the diameter $d_1$ of which is less than double the diameter $d_2$ of the single-pole lens 61. This condition is necessary for sufficient shielding of the field in the region of the specimen. Furthermore the diameter $d_1$ of the opening 63a of the control electrode 63 should be at least half as great as the diameter $d_3$ of the beam tube 62a. Otherwise the particles emitted from the specimen 8 are not guaranteed to reach the detector 7a disposed above the lens arrangement 6.

Figure 3:
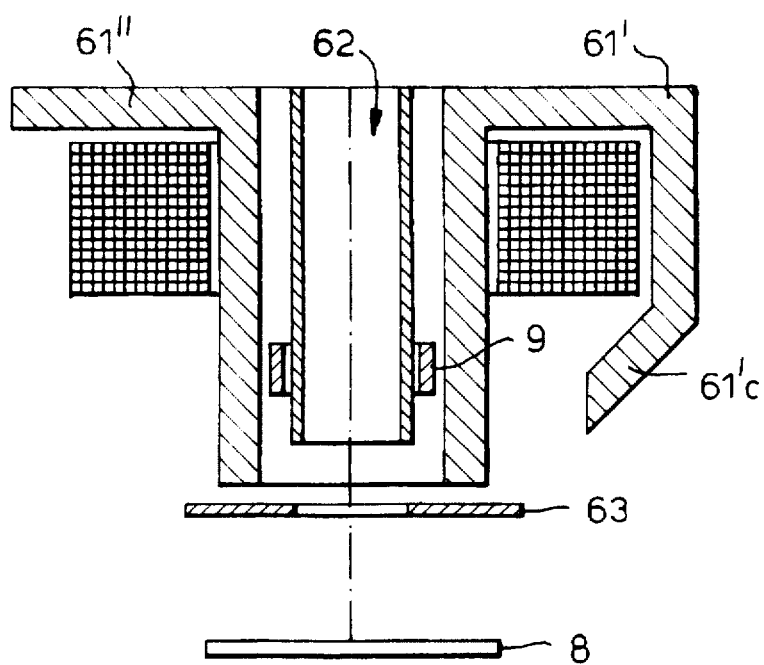
FIG. 3 shows a schematic representation of two variants of the single-pole lens.

Two further embodiments of single-pole lenses 61', 61" are shown in FIG. 3. The embodiment on the right shows a single-pole magnetic lens 61' with an outer pole piece 61'c which is at least partially conical. In the single-pole lens 61" shown in the left-hand side the outer pole piece has been removed entirely.

The charged particle beam device according to the invention is designed particularly for the low voltage range, i.e. for final beam energies lower than 5 keV, preferably between 0.5 and 2.5 keV. A particularly suitable source for this purpose is a so-called field emission source or other sources with an energy width of less than 1 eV, for example thermal field emission sources or photo cathodes. With the combination according to the invention of an electrostatic lens with a single-pole lens particularly great working distances can be achieved for the low voltage range with good resolving and imaging properties. Thus in particular specimen holders can also be used which have contacting means protruding above the specimen.

We claim:

1. Charged particle beam device comprising:
   a) a source for generating a charged particle beam,
   b) an electrostatic-magnetic lens assembly for focusing the charged particle beam, said lens assembly having a single-pole magnetic lens, an electrostatic lens incorporated into said magnetic lens and a deflector incorporated into said magnetic lens for deflecting the focused charged particle beam, and
   c) at least one detector for detecting secondary and/or back-scattered particles emitted from a specimen.

2. The device of claim 1 wherein said electrostatic lens generates a rotationally symmetrical electrical field and has at least two electrodes which can be held at different potentials whereby the charged particles are decelerated in the field of the electrostatic lens from a first energy to a lower second energy.

3. The device of claim 2 including an additional control electrode situated between said electrostatic lens and the specimen in the path of said charged particle beam and connectable to a variable potential for adjustment of the electrical field strength in the region of the specimen.

4. The device of claim 3 wherein the distance between said control electrode and the specimen is at least three times the distance between said control electrode and said single-pole lens.

5. The device of claim 3 wherein said single-pole lens has an internal bore and said control electrode has an opening, said opening having a diameter less than double that of said single-pole lens.

6. The device of claim 2 wherein at a final beam energy of the charged particles of less than 5 keV a working distance of more than 5 mm is provided between said lens assembly and the specimen.

7. The device of claim 6 wherein said final beam energy is between 0.5 and 2.5 keV.

8. The device of claim 2 wherein one of said two electrodes of said electrostatic lens is constructed as a beam tube.

9. The device of claim 8 wherein said beam tube is constructed of non-conductive material having a thin conductive coating.

10. The device of claim 8 wherein said beam tube is accommodated concentrically within an internal bore of said single-pole lens.

11. The device of claim 8 wherein said control electrode has an opening with a diameter at least half as great as that of said beam tube.

12. The device of claim 2 wherein said single-pole lens has inner and outer pole pieces, said outer pole piece being at least partially conical in shape.

13. The device of claim 1 wherein said electrostatic lens generates a rotationally symmetrical field and has at least two electrodes operable at different potentials such that the charged particles are decelerated in the field of said electrostatic lens from a first energy to a lower second energy and wherein one of said two electrodes of said electrostatic lens is constructed as a beam tube accommodated concentrically within an internal bore of said single-pole lens.

14. The device of claim 13 wherein said deflector is accommodated in said single-pole lens between the wall of said internal bore and said beam tube.

15. The device of claim 13 including a seal provided between said beam tube and said single-pole lens whereby said deflector is situated outside the vacuum.

16. The device of claim 1 including a vacuum source for generating a vacuum in the region of said charged particle beam.

17. The device of claim 16 wherein said single-pole lens includes a field coil and a seal shielding said field coil from the vacuum.

18. The device of claim 1 wherein said at least one detector is arranged in front of said electrostatic-magnetic lens assembly in the direction of the charged particle beam.

19. The device of claim 1 wherein said at least one detector is arranged behind said lens assembly in the direction of the charged particle beam.

20. The device of claim 1 including at least two of said detectors, one of which is provided in front of said lens assembly and the other of which is provided behind said lens assembly.

21. The device of claim 20 wherein at least one of said at least two detectors is divided into segments which provide output signals that can be processed separately from one another.

22. The device of claim 1 wherein said source has an energy width of less than 1 eV.

\* \* \* \* \*